(12) United States Patent
Tang

(10) Patent No.: US 8,093,700 B2
(45) Date of Patent: Jan. 10, 2012

(54) PACKAGING MILLIMETER WAVE MODULES

(75) Inventor: Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 481 days.

(21) Appl. No.: 12/335,589

(22) Filed: Dec. 16, 2008

(65) Prior Publication Data

US 2010/0148333 A1    Jun. 17, 2010

(51) Int. Cl.
  *H01L 21/50*  (2006.01)
  *H01L 23/02*  (2006.01)

(52) U.S. Cl. ........ 257/684; 257/686; 257/723; 257/773; 257/774; 257/777; 257/E23.013; 257/E23.124; 257/E23.169; 257/E23.17; 257/E25.023

(58) Field of Classification Search ............ 257/686, 257/723, 773, 774, 777, E23.013, E23.124, 257/E23.169, E23.17, E25.023, 684
See application file for complete search history.

(56) References Cited

U.S. PATENT DOCUMENTS

| | | | |
|---|---|---|---|
| 5,790,384 A * | 8/1998 | Ahmad et al. ............ 361/760 |
| 5,852,391 A * | 12/1998 | Watanabe et al. | |
| 5,915,168 A * | 6/1999 | Salatino et al. | |
| 6,066,386 A * | 5/2000 | Boyko et al. ............ 428/209 |
| 6,072,236 A * | 6/2000 | Akram et al. | |
| 6,228,684 B1 * | 5/2001 | Maruyama | |
| 6,294,406 B1 * | 9/2001 | Bertin et al. ............ 438/109 |
| 6,441,697 B1 * | 8/2002 | Garland et al. | |
| 6,489,679 B2 * | 12/2002 | Tsukiyama et al. | |
| 6,732,913 B2 * | 5/2004 | Alvarez | |
| 6,774,748 B1 * | 8/2004 | Ito et al. | |
| 6,873,044 B2 | 3/2005 | Ammar | |
| 6,953,985 B2 | 10/2005 | Lin et al. | |
| 7,285,865 B2 | 10/2007 | Kwon et al. | |
| 2001/0004129 A1 | 6/2001 | Tsukiyama et al. | |
| 2006/0113653 A1 * | 6/2006 | Xiaoqi et al. ............ 257/686 |
| 2007/0135013 A1 | 6/2007 | Faris | |

* cited by examiner

*Primary Examiner* — Eugene Lee
*Assistant Examiner* — Peniel M Gumedzoe
(74) *Attorney, Agent, or Firm* — Charles Bergere

(57) ABSTRACT

A module, which in one embodiment may be a packaged millimeter waver module, includes a semiconductor lid portion; a packaging portion attached to the lid portion, wherein the packaging portion comprises a plurality of vias, a carrier portion, wherein a first semiconductor die is attached to the carrier portion, the packaging portion is attached to the carrier portion so that the packaging portion is over the carrier portion and the semiconductor die is within an opening in the packaging portion, and the lid portion and the carrier portion form an first air gap around the first semiconductor device.

14 Claims, 3 Drawing Sheets

PACKAGING MILLIMETER WAVE MODULES

BACKGROUND

1. Field

This disclosure relates generally to wafer level packaging, and more specifically, to packaging of millimeter wave modules.

2. Related Art

To communicate radio communications, it is desirable to use the microwave millimeter waver spectrum to decrease noise. Millimeter wave modules function at wavelengths on the order of millimeters. For example, a radio frequency of approximately 60 GHz corresponds to approximately a 5 millimeter wavelength.

Semiconductor devices are packaged to protect them from the environment. Many different types of package technologies exist and the one chosen often depends on the type of device being packaged.

Packaging such microwave millimeter wave devices is currently expensive and the packages do not often prevent interferences in such packages. For example, traditional wafer level packaging is not suitable for millimeter wave applications because the high frequency signals create interference. To reduce signal emission as to decrease or eliminate cross-interference between devices or devices and signal lines, electromagnetic bandgap (EGB) structures are added in some prior art. These structures limit design and performance and require a design evaluation cycle. Therefore, a need exists for an improved package that does not have the disadvantages of the existing packages.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, guided signal paths are formed in a silicon substrate wafer, package wafer and lid wafer using silicon wafer level packaging process. The guided signal paths may be used for high performance applications. The silicon carrier wafer may be patterned with signal lines, through-silicon vias, bonding structures and a patterned metallization layer. Portions of the guided signal line are formed in the silicon substrate wafer. The silicon package wafer is prepared by forming patterned through silicon vias and a metallization layer. The package wafer is patterned using, for example, laser cutting or other chemical methods. Hence, another portion of the guided signal line is formed. The silicon package lid wafer is prepared with a metallization layer, which is a portion of the guided signal line structure. In one embodiment, the silicon package wafer and the package lid can be combined.

Figure 1:
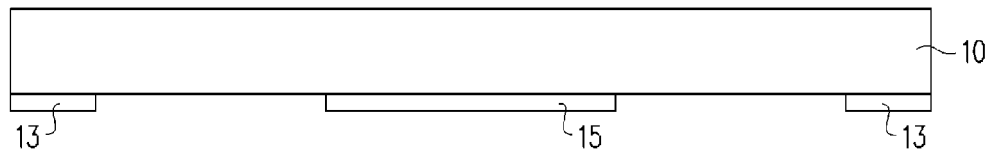
FIG. 1 illustrates a cross-section of a portion of a first semiconductor substrate in accordance with an embodiment.

FIG. 1 illustrates a cross-section of a portion of a first semiconductor substrate 10 in accordance with an embodiment. In one embodiment, the first semiconductor substrate 10 is lid substrate. The semiconductor substrate can be any semiconductor material or combinations of materials, such as gallium arsenide, silicon germanium, silicon-on-insulator (SOI), silicon, monocrystalline silicon, the like, and combinations of the above. In the embodiment illustrated, metallization 13 and 15 is formed on at least one surface of the first semiconductor substrate 10. The metallization 13 and 15 can be formed by depositing a metal, such as copper, and patterning it using a mask and an etch process.

Figure 2:
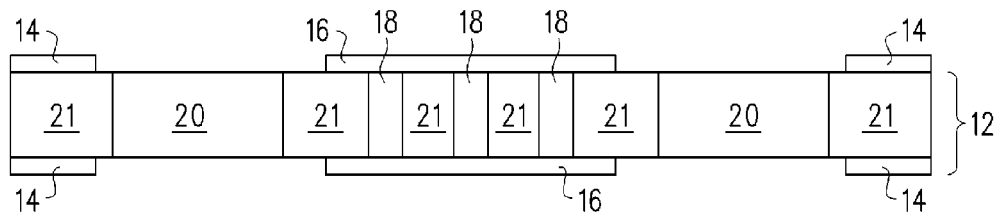
FIG. 2 illustrates a cross-section of a portion of a second semiconductor substrate having vias and openings in accordance with an embodiment.

FIG. 2 illustrates a cross-section of a portion of a second semiconductor substrate 12 having vias 18, which may also be referred to as a plurality of vias, and openings 20, which may also be referred to as spacings, in accordance with an embodiment. In one embodiment, the second semiconductor substrate 12 is a package substrate. In one embodiment, the openings have a width of approximately 40 to approximately 200 microns. The second semiconductor substrate 12 can be any material discussed for the first semiconductor substrate 10; the second semiconductor substrate 12 may be the same material or a different material than the first semiconductor substrate 10. The vias 18 are embedded in semiconductor 21, which can be any suitable semiconductor material. In one embodiment, the semiconductor 21 is a highly resistive semiconductor material. In one embodiment, the semiconductor 21 is silicon. The vias 18 each include conductive material. For example, the vias 18 may include copper, tungsten, nickel, the like, and combinations of the above. In one embodiment, the vias 18 are completely filled with a conductive material. In another embodiment, the vias 18 are partly filled with a conductive material and partly filled with an insulating material, such as silicon dioxide. As shown in FIG. 2, the semiconductor 21 (or at least a portion of the semiconductor 21) is on either side of a via 18. The semiconductor 21 with the vias 18 is laterally between the openings 20, which as will be better understood later, are left as spaces to receive semiconductor devices, either active or passive devices. A skilled artisan recognizes that having two openings in the semiconductor substrate 12 are shown for exemplary purposes. There may only be one opening. Likewise, in other embodiments there may be more than two openings. In the embodiment illustrated, metallization 14 and 16 are formed on both surfaces of the second semiconductor substrate 12. The metallization 14 and 16 can be any material and be made by any process like the metallization 13 and 15 in FIG. 1. In one embodiment, the first semiconductor substrate 10 and the second semiconductor substrate 12 are one, instead, of two substrates. In other words the elements described above for the first 10 and second 12 semiconductor substrates, such as elements 13, 15, 14, 16, 18, and 20 are formed on or within the same substrate. In one embodiment elements 13 and 15 may not be needed; in another embodiment elements 14 and 16 on the bottom of FIG. 2 may not be needed.

Figure 3:
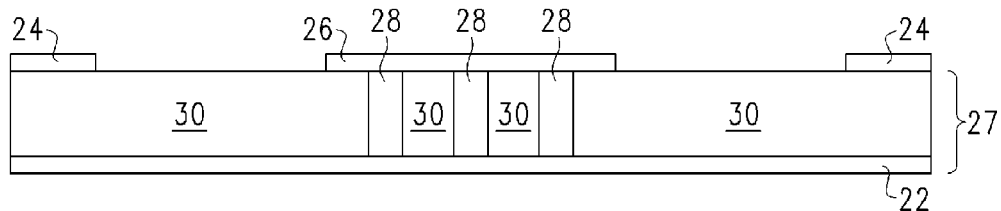
FIG. 3 illustrates a cross-section of a portion of a third semiconductor substrate having vias in accordance with an embodiment.

FIG. 3 illustrates a cross-section of a portion of a third semiconductor substrate 27 having vias in accordance with an embodiment. The third semiconductor substrate 27 can be any material discussed for the first semiconductor substrate 10 or the second semiconductor substrate 12; the third semiconductor substrate 27 may be the same material or a different material than the first semiconductor substrate 10, the second semiconductor substrate 12, or both. The third semiconductor substrate 27 includes vias 28, which include conductive material and can be any material that is discussed above for the vias 18. The material used for the vias 28 and the vias 18 need not be the same. In one embodiment, metallization 24 is formed on one side of the third semiconductor substrate 27 and metallization 28, which is either unpatterned or at least has an unpatterned portions, is formed on the opposite surface of the third semiconductor substrate 27.

Figure 4:
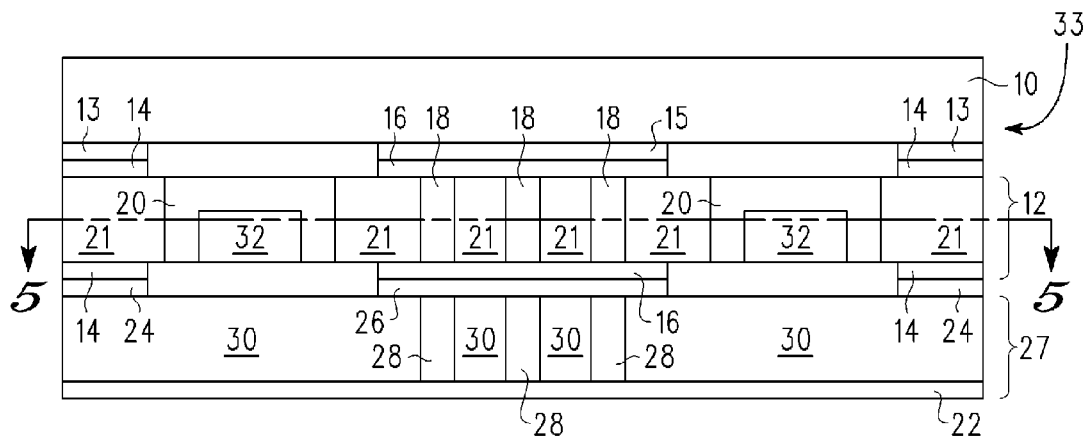
FIG. 4 illustrates a cross-section of a portion of a package including the first semiconductor substrate of FIG. 1, the second semiconductor substrate of FIG. 2, the third semiconductor substrate of FIG. 4, and devices.

FIG. 4 illustrates a cross-section of a portion of a package 34 including the first semiconductor substrate 10, the second semiconductor substrate 12, the third semiconductor substrate 27, and semiconductor devices or die 32. The semiconductor devices 32 can be any type of device, such as an active device (e.g., microprocessor) or passive device (e.g., capacitor). In one embodiment, at least one of the semiconductor devices 32 transmits signals in the millimeter wave range. The package of FIG. 4 is formed by attaching the semiconductor devices 32 to the third semiconductor substrate 27. The location of the semiconductor devices 32 is determined so that when the second semiconductor substrate 12 is aligned to the third semiconductor substrate 27, the semiconductor devices 32 will be in the openings 20. Hence, in the embodiment in FIG. 4, the vias 18 and the semiconductor 21 are laterally between the semiconductor devices 32. The vias 18 are farther from the edge 33 of the package 34 than at least one semiconductor die 32. The vias are not located at the edge 33 of the package 34.

The semiconductor devices 32 can be attached to the third semiconductor substrate 27, for example, by using solder paste or solder balls or bumps. In one embodiment, the semiconductor devices 32 may be wirebonded to conductive material over in within the third semiconductor substrate 27.

The second semiconductor substrate 12 is attached to the third semiconductor substrate 27 by a conductive bonding process or a solder bump process, for example. The first semiconductor substrate 10 is attached to the second semiconductor substrate 12 either before or after the second semiconductor substrate 12 is attached to the third semiconductor substrate 27 by a conductive bonding process or a solder bump process, for example. In one embodiment, the first semiconductor substrate 10 is attached to the second semiconductor substrate 12 at the same time that the second semiconductor substrate 12 is attached to the third semiconductor substrate 27. In another embodiment, the first semiconductor substrate 10 is attached to the second semiconductor substrate 12 at the different time that the second semiconductor substrate 12 is attached to the third semiconductor substrate 27. In this case, it is desirable to have the two separate bonding steps occur at two different temperatures and it is preferable that the second bonding process occurs at a lower temperature than the first. This avoids the first bonding from being affected during the second bonding process. The different temperatures can be created by using different bonding materials. Any suitable bonding material can be used.

As shown in FIG. 4, the first semiconductor substrate 10, the second semiconductor substrate 12, and the third semiconductor substrate 13 form an air gap or cavity around the semiconductor devices 32. Hence, at least one surface (if not 3 surfaces) of each of the semiconductor devices 32 are in contact with air. Metallization 15 is electrically coupled to metallization 16 on one side of the second semiconductor device 12, which is electrically coupled to the vias 18 (or at least a portion of the vias 18). The vias 18 (or at least a portion of the vias 18) are electrically coupled to the metallization 16 on the other side of the second semiconductor device 12 and metallization 26. The vias 18 are also coupled to the vias 18 through the metallization 16 and 26. The vias 28 and hence the vias 18 as well are electrically coupled to the metallization 22. In one embodiment, non-critical signal lines may be present between vias 18.

In one embodiment, the vias 18 in the semiconductor 21 are grounded vias. The vias 18 are used to minimize leakage signals so that the leakage signals do not negatively impact the semiconductor devices 32. Without the presence of the vias 18 and the semiconductor 21 the leakage signals will travel through the air and negatively impact the semiconductor devices 32. The vias 18 also shield the other parts of the transmission line, which in one embodiment includes vias 28 and metallization 26 and 16, from other signals. Hence, the vias 18 are a shielding portion of the transmission line. The transmission line is now present in multiple substrates and layers of the package 34. The metallization and vias, especially metallization 16, forms the guided coplanar waveguide lines, which is a signal line for high frequency applications. Because the vias 18 are grounded, the signal line is a shielded signal line. A computer assisted design tool can be used to determine the optimum placement of the vias for a given design.

Figure 5:
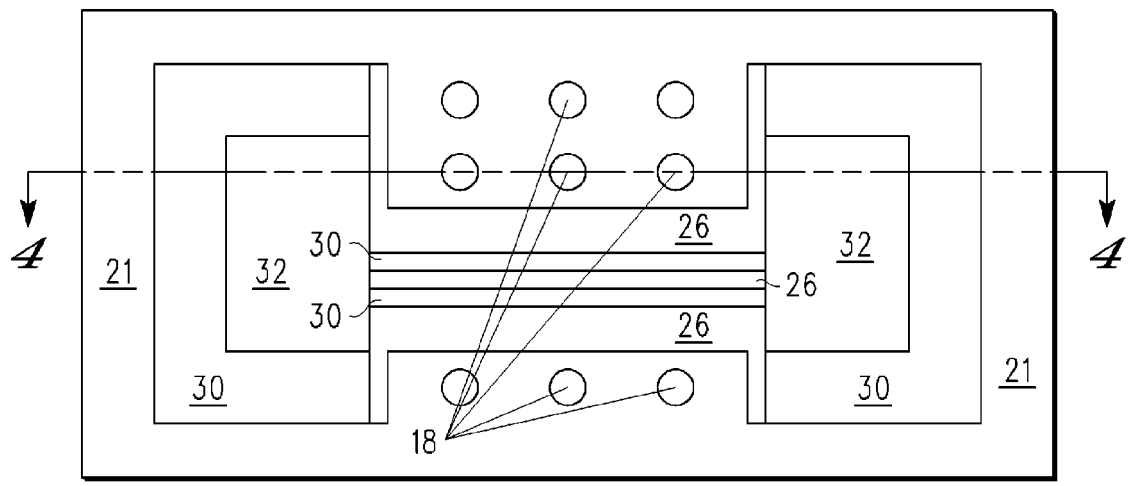
FIG. 5 illustrates a top-down view of the portion of the second semiconductor substrate of FIG. 4 in accordance with an embodiment.

FIG. 5 illustrates a top-down view of the portion of the second semiconductor substrate 12, and portions of the third semiconductor substrate 27 in accordance with an embodiment. In this embodiment, portions of the metallization 26 are substantially parallel to each other. The other metallization, such as metallization 16, may have the same pattern or a different pattern as metallization 26. FIG. 5 illustrates one transmission line, which may also be referred to a signal line. The transmission line is element 26 that is between elements 30.

Figure 6:
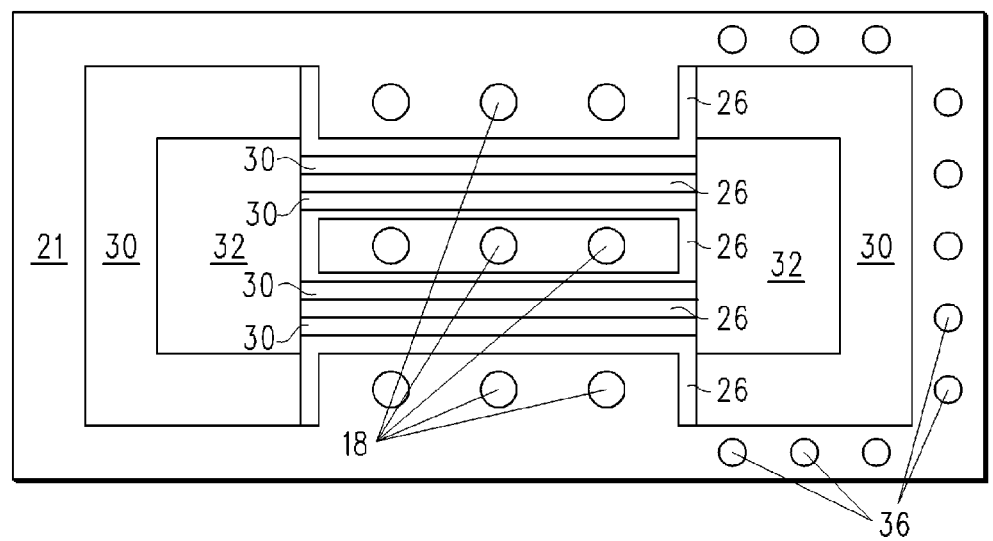
FIG. 6 illustrates a top-down view of a portion of the second semiconductor substrate in accordance with an embodiment.

FIG. 6 illustrates a top-down view of a portion of the second semiconductor substrate 12, and portions of the third semiconductor substrate 27 in accordance with an embodiment. As illustrated, the one of the metallizations 26 can surround a plurality of vias 18. In this embodiment, portions of the metallization 26 are substantially parallel to each other. The other metallization, such as metallization 16, may have the same pattern or a different pattern as metallization 26. FIG. 6 illustrates two transmission lines. Any number of transmission lines may be present.

Figure 7:
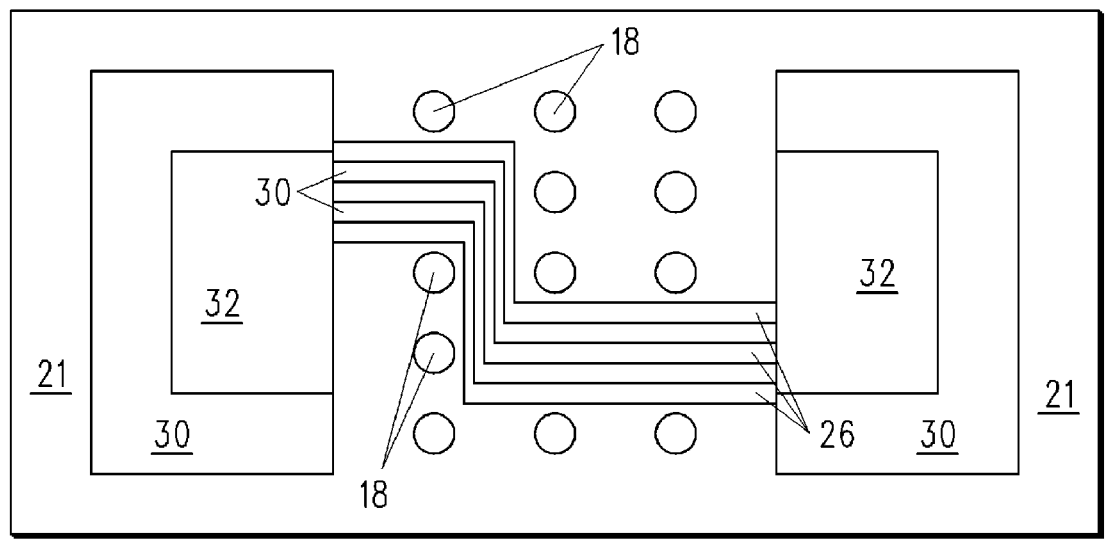
FIG. 7 illustrates a top-down view of a portion of the second semiconductor substrate in accordance with an embodiment.

FIG. 7 illustrates a top-down view of a portion of the second semiconductor substrate 12, and portions of the third semiconductor substrate 27 in accordance with an embodiment. As illustrated, the metallization 26 is substantially "Z" shaped, so that the metallization 26 looks like from a top view a Z in a given direction. In the illustrated embodiment, portions of the metallization 26 are substantially parallel to each other. The other metallization, such as metallization 16, may have the same pattern.

Item 1 includes a module, which may be a packaged device, such as a package millimeter wave module, including a semiconductor lid portion, a packaging portion attached to the lid portion, wherein the packaging portion includes a plurality of vias, a carrier portion, wherein a first semiconductor die is attached to the carrier portion, the packaging portion is attached to the carrier portion so that the packaging portion is over the carrier portion and the semiconductor die is within an opening in the packaging portion, and the lid portion and the carrier portion form an first air gap around the first semiconductor device. Item 2 includes the module of item 1, wherein the plurality of vias are surrounded by dielectric. Item 3 includes the module of item 3, wherein the plurality of vias is farther from the edge of the module than the first semiconductor die. Item 4 includes the module of item 1, wherein the semiconductor lid portion is a first semiconductor substrate, the packaging portion is a second semiconductor substrate, and the carrier portion is a third semiconductor substrate. Item 5 includes the module of item 4, further including a second semiconductor die, wherein:

the second semiconductor die is attached to the third substrate, and the first substrate and the third substrate form a second air gap around the second semiconductor device. Item 6 includes the module of item 5, wherein the plurality of vias and the metallization are laterally between the first semiconductor die and the second semiconductor die. Item 7 includes the module of item 1, wherein the metallization includes a plurality of parallel lines. Item 8 includes the module of item 1, wherein the metallization is arranged is a substantially "Z" shape configuration. Item 9 includes the module of item 1, wherein at least a portion of the metallization surrounds at least one of the plurality of vias. Item 10 includes the module of item 1, wherein the plurality of vias are arranged in an array, wherein the array has a row that includes at least two vias and a column that includes at least two vias.

Item 11 includes a module including:a first substrate, wherein the first substrate is a semiconductor substrate, a second substrate over the first substrate, wherein the second substrate includes a plurality of vias embedded in a dielectric region, a plurality of interconnects under at least a portion of the plurality of vias and coupled to the at least a portion of the plurality of vias a third substrate over the second substrate; and a first semiconductor die between the first substrate and the third substrate, wherein at least one surface of the first semiconductor die is in contact with air, Item 12 includes the module of item 11, wherein the plurality of interconnects are parallel lines. Item 13 includes the module of item 12, wherein the plurality of interconnects are in a "Z" shape. Item 14 includes the module of item 11, further including a second semiconductor die between the first substrate and the third substrate, wherein at least one surface of the second semiconductor die is in contact with air. Item 15 includes the module of item 14, wherein the plurality of vias and the plurality of interconnects are between the first semiconductor die and the second semiconductor die. Item 16 includes the module of item 15, wherein the plurality of interconnects electrically couples the first semiconductor die to the second semiconductor die. Item 17 includes the module of item 11, wherein the plurality of vias is farther from the edge of the module than the first semiconductor die. Item 18 includes the module of item 1, wherein the first substrate includes conductive material, wherein the conductive material is coupled to at least a portion of the plurality of vias. Item 19 includes the module of item 1, wherein the plurality of vias are arranged in an array of N by M, wherein both N and M are greater than 2.

Item 20 includes a method of forming a module including providing a first substrate, providing a second substrate, wherein the second substrate includes a plurality of vias embedded in a dielectric layer, providing a third substrate, attaching a semiconductor die to the third substrate, attaching the second substrate to the third substrate so that the second substrate is over the third substrate and the semiconductor die is within an opening in the second substrate, and attaching the first substrate to the second substrate so that the first substrate and the third substrate form and air gap around the semiconductor device.

By now it should be appreciated that there has been provided a silicon wafer level packaging platform with high performance critical signal paths for the millimeter wave module. Interference between individual devices in the module or package is decreased, minimized, or eliminated. Furthermore, interference between transmission lines with surrounding circuits is decreased, minimized, or eliminated. Good guided signal paths are provided and the need for EGB structures is eliminated, which decreases costs.

Although the invention is described herein with reference to specific embodiments, various modifications and changes can be made without departing from the scope of the present invention as set forth in the claims below. For example, a skilled artisan recognizes that any configuration of metallization besides those illustrated in FIGS. 5-7 can be used. In addition, a skilled artisan recognizes that although the described packaging is desirable for millimeter wave devices, the packaging can be used for any type of device, such as any logic devices, memory devices, active devices, the like or combinations of the above. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A module, comprising:
a semiconductor lid portion;
a packaging portion attached to the lid portion, wherein the packaging portion comprises a plurality of vias and metallization connected to at least some of the plurality of vias;
a carrier portion, wherein:
a first semiconductor die is attached to the carrier portion;

the packaging portion is attached to the carrier portion so that the packaging portion is over the carrier portion and the semiconductor die is within an opening in the packaging portion;

the semiconductor lid portion and the carrier portion form a first air gap around the first semiconductor die, and the semiconductor lid portion is a first semiconductor substrate, the packaging portion is a second semiconductor substrate, and the carrier portion is a third semiconductor substrate; and a second semiconductor die is attached to the third semiconductor substrate;

the first semiconductor substrate and the third semiconductor substrate form a second air gap around the second semiconductor die; and the plurality of vias and the metallization are laterally disposed between the first semiconductor die and the second semiconductor die.

2. The module of claim 1, wherein the plurality of vias are surrounded by dielectric.

3. The module of claim 1, wherein the plurality of vias is farther from the edge of the module than the first semiconductor die.

4. The module of claim 1, wherein the metallization comprises a plurality of parallel lines.

5. A module, comprising:
a semiconductor lid portion;
a packaging portion attached to the lid portion, wherein the packaging portion comprises a plurality of vias and metallization connected to at least some of the plurality of vias;
a carrier portion; and
a first semiconductor die attached to the carrier portion, wherein the packaging portion is attached to the carrier portion so that the packaging portion is disposed over the carrier portion and the semiconductor die is within an opening in the packaging portion,
wherein the semiconductor lid portion and the carrier portion form a first air gap around the first semiconductor die, and
wherein the metallization is arranged in a substantially "Z" shape configuration.

6. The module of claim 1, wherein at least a portion of the metallization surrounds at least one of the plurality of vias.

7. The module of claim 1, wherein the plurality of vias are arranged in an array, wherein the array has a row that includes at least two vias and a column that includes at least two vias.

8. A module, comprising:
a first semiconductor substrate;
a second substrate over the first semiconductor substrate, wherein the second substrate comprises:
a plurality of vias embedded in a dielectric region;
a plurality of interconnects under at least a portion of the plurality of vias and coupled to the at least a portion of the plurality of vias;
a third substrate over the second substrate;
a first semiconductor die between the first semiconductor substrate and the third substrate, wherein at least one surface of the first semiconductor die is in contact with air; and
a second semiconductor die between the first semiconductor substrate and the third substrate, wherein at least one surface of the second semiconductor die is in contact with air, wherein the plurality of vias and the plurality of interconnects are disposed between the first semiconductor die and the second semiconductor die.

9. The module of claim 8, wherein the plurality of interconnects are parallel lines.

10. The module of claim 8, wherein the plurality of interconnects are in a "Z" shape.

11. The module of claim 8, wherein the plurality of interconnects electrically couples the first semiconductor die to the second semiconductor die.

12. The module of claim 8, wherein the plurality of vias is farther from the edge of the module than the first semiconductor die.

13. The module of claim 8, wherein the first semiconductor substrate comprises conductive material, wherein the conductive material is coupled to at least a portion of the plurality of vias.

14. The module of claim 8, wherein the plurality of vias are arranged in an array of N by M, wherein both N and M are greater than 2.

* * * * *